United States Patent [19]

Mitsuoka

[11] Patent Number: 4,697,219
[45] Date of Patent: Sep. 29, 1987

[54] SNUBBER CIRCUIT FOR GATE TURNOFF THYRISTOR

[75] Inventor: Hiroshi Mitsuoka, Itami, Japan

[73] Assignee: Mitsubishi Denki Kabushiki Kaisha, Tokyo, Japan

[21] Appl. No.: 838,835

[22] Filed: Mar. 12, 1986

[30] Foreign Application Priority Data

Mar. 25, 1985 [JP] Japan .................................. 60-62485

[51] Int. Cl.$^4$ ............................................ H02H 7/122
[52] U.S. Cl. ...................................... 361/93; 361/91; 361/100; 363/54; 363/57
[58] Field of Search .................... 361/86, 87, 93, 98, 361/100; 363/54, 57, 58; 307/252 C

[56] References Cited

U.S. PATENT DOCUMENTS 4,275,430 6/1981 Seki et al. ............................. 363/54
4,535,378 8/1985 Endo ................................. 361/87 X

FOREIGN PATENT DOCUMENTS 218866 12/1983 Japan ..................................... 363/54

Primary Examiner—A. D. Pellinen
Assistant Examiner—Derek S. Jennings
Attorney, Agent, or Firm—Leydig, Voit & Mayer

[57] ABSTRACT

For suppressing an abnormal rise in the anode-cathode voltage of a gate turnoff thyristor (GTO), a main snubber circuit and a number of sub snubber circuits are disposed across the anode and cathode of the GTO, and selected ones of the sub snubber circuits are selectively activated by a control circuit in accordance with the magnitude of a main current flowing through the GTO in order to minimize the power loss of the entire snubber circuit. The main snubber circuit includes a capacitor of comparatively small capacity corresponding to a comparatively small and steady main current. The control circuit includes a current detector detecting the main current. For a small steady load, only the main snubber circuit is operated, but at higher loads the control circuit selectively activates an increasing number of the sub snubber circuits. For each sub snubber circuit, the control circuit preferably includes a respective comparator for comparing an output of the current detector to a respective predetermined value and a respective turn-on signal generator for selectively activating the sub snubber circuit in response to an output of the respective comparator.

5 Claims, 5 Drawing Figures

4,697,219

SNUBBER CIRCUIT FOR GATE TURNOFF THYRISTOR

BACKGROUND OF THE INVENTION

This invention relates to a snubber circuit for a gate turnoff thyristor, and more particularly to improvements in a snubber circuit for suppressing the abnormal rise of the anode - cathode voltage of a gate turnoff thyristor.

The gate turnoff thyristor (hereinbelow, termed 'GTO') is an element of the so-called self-extinguishing type in which a main current can be interrupted by causing a negative current to flow through a gate. Since it does not require a commutation circuit, it has the advantage that devices can be made smaller in size. It has therefore come into extensive use in chopper circuits, various inverter devices, etc. However, unless the rise rate of the anode voltage of the GTO during the interrupting operation is suppressed below a value prescribed for the GTO element in interrupting the main current (anode current) of the GTO by means of the gate, the turnoff of the GTO will fail, and the GTO will be destroyed on that occasion.

FIG. 1 is a circuit diagram which shows a prior-art example of a snubber circuit for suprressing the anode voltage rise rate (dV/dt) of a GTO. Referring to the figure, the snubber circuit 2 is connected across the anode 7 and cathode 8 of the GTO 1. This snubber circuit 2 includes a diode 3, a capacitor 4 and a resistor 5. The capacitor 4 and the diode 3 are connected in series, and are connected across the anode 7 and the cathode 8. The diode 3 has its anode connected to the anode 7 of the GTO 1 through the capacitor 4 and has its cathode connected to the cathode 8 of the GTO 1 so as to have the same polarity as that of the GTO 1. The resistor 5 is connected in parallel with the diode 3. On the other hand, a gate drive circuit 6 for supplying the gate electrode 9 of the GTO 1 with a gate pulse current for turning it 'on' and 'off' is connected across the gate electrode 9 and the cathode 8. An inductance 10 connected to the anode 7 is the leakage inductance of a main circuit (not shown).

FIG. 2 is a waveform diagram for explaining the turnoff operation of the GTO 1 shown in FIG. 1. Referring now to FIG. 2, the operation of the circuit in FIG. 1 will be described. When a main current $I_A$ is flowing from the anode 7 toward the cathode 8 of the GTO 1, a gate reverse current $I_{GR}$ is started flowing from the cathode 8 toward the gate electrode 9 of the GTO 1. Then, the main current $I_A$ begins to suddenly decrease after a certain fixed delay time $t_s$. At this time, an abrupt spike voltage is generated by the leakage inductance (stray inductance) 10 which exists in the main circuit. As spike voltage is about to be applied across the anode 7 and cathode 8 of the GTO 1, a bypass current temporarily flows through the capacitor 4 via the diode 3, so that a sudden change in the main current is restrained, and the anode voltage rise rate (dV/dt) during the interrupting operation can be supressed to the prescribed value. The rate dV/dt in this case is roughly expressed by $dV/dt = I_{GQ}/C$ where $I_{GQ}$ denotes a turnoff current (the main current immediately before the turnoff) and C denotes the capacitance of the capacitor 4. Charges stored in the capacitor 4 during the interruption of the anode current are quickly discharged through the resistor 5 within the turn-on period of the GTO 1, so that it may be ready for the next turnoff cycle.

Meanwhile, letting f denote the on/off recurrence frequency of the GTO 1 and $V_c$ denote a circuit voltage (the charged voltage of the capacitor 4), a power loss $W_s$ by this snubber circuit 2 is expressed by $W_s = (\frac{1}{2}) C \cdot V_c^2 \cdot f$ and is proportional to the capacitance C of the capacitor 4.

The prior-art snubber circuit for the GTO is constructed as described above. Therefore, in a case where the main current $I_A$ and hence the turnoff current $I_{GQ}$ changes, the capacitance C of the capacitor 4 needs to be set in conformity with the maximum value thereof. Accordingly, there has been the problem that, for a light load whose turnoff current $I_{GQ}$ is smaller than the maximum value, an excess snubber loss arises on account of the unnecessarily large capacity of the capacitor (the snubber loss is the power loss which occurs due to the charging and discharging of the capacitor and which is mostly consumed by the resistor 5 of the snubber circuit). This has been a serious problem especially in an apparatus of which a short-time overload bearing capacity is required.

SUMMARY OF THE INVENTION

This invention has the objective to eliminate the problem as described above, and has for its main object to provide a snubber circuit for a GTO according to which, even when the magnitude of a turnoff current changes, the loss of the snubber circuit can be minimized in conformity with the change.

This invention for accomplishing the object consists in that, besides a main snubber circuit, a number of sub snubber circuits are disposed across the anode and cathode of a GTO, and that the sub snubber circuits are selectively activated in accordance with the magnitude of a main current flowing through the GTO, thereby to suppress the loss of the whole snubber circuit to the minimum.

DESCRIPTION OF THE PREFERRED EMBODIMENTS

Figure 1:
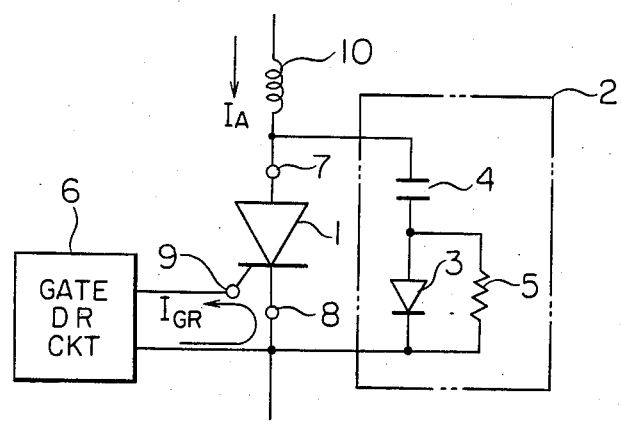
FIG. 1 is a circuit diagram showing an example of a prior-art snubber circuit for a GTO.
Figure 2:
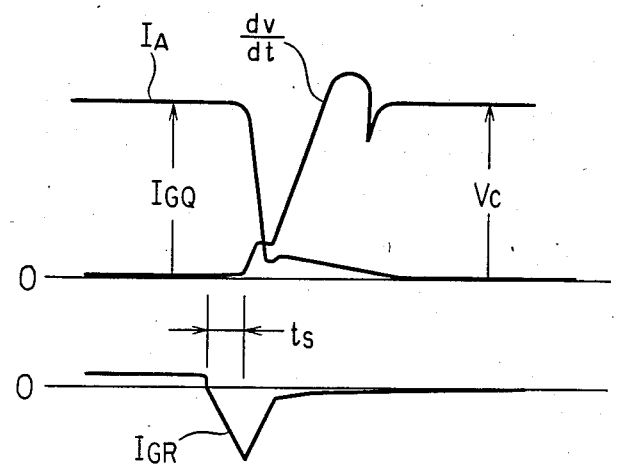
FIG. 2 is a waveform diagram for explaining the operation of the GTO shown in FIG. 1 at the interruption of the main current thereof.
Figure 3:
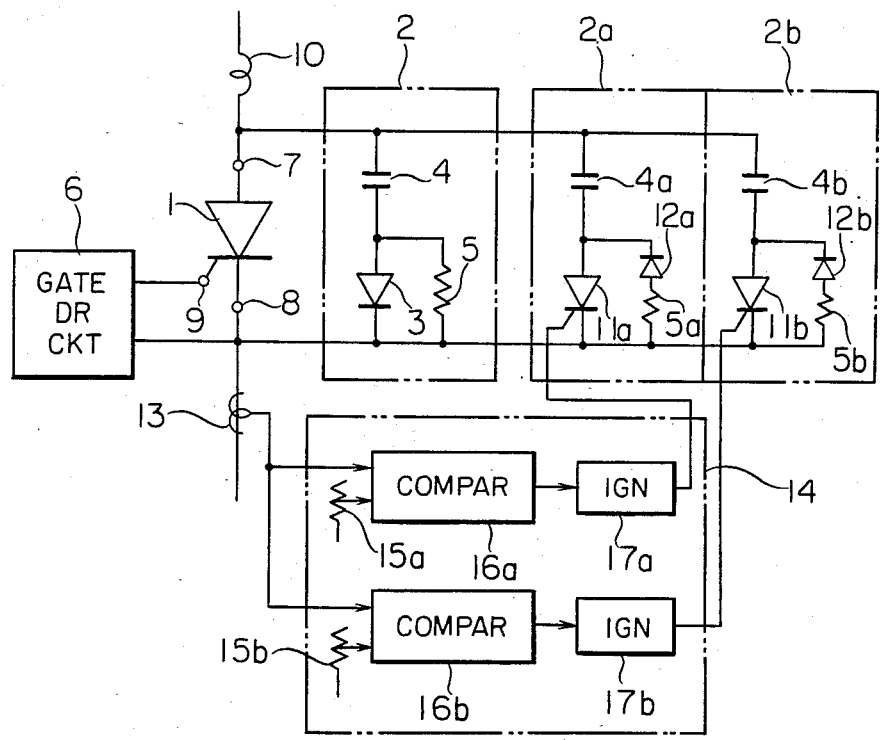
FIG. 3 is a circuit diagram showing an embodiment of this invention.

FIG. 3 is a circuit diagram showing one embodiment of this invention. In this invention, the same portions as in the circuit of FIG. 1 are assigned the same reference numerals and shall not be described in detail. Referring to FIG. 3, across the anode 7 and cathode 8 of a GTO 1, a main snubber circuit 2 similar to that in FIG. 1 is connected, and sub snubber circuits 2a and 2b are also connected. Since the sub snubber circuits 2a and 2b are similarly arranged, the arrangement of the sub snubber circuit 2a shall be typically described here. The sub snubber circuit 2a includes a capacitor 4a, a thyristor 11a, a resistor 5a and a diode 12a. The capacitor 4a and thyristor 11a are connected in series, and are connected across the anode 7 and cathode 8. The thyristor 11a has its anode connected to the anode 7 of the GTO 1 through the capacitor 4a and its cathode connected to the cathode 8 of the GTO 1 so as to have the same polarity as that of the GTO 1. The diode 12a and resistor 5a are connected in series, and are connected across the anode and cathode of the thyristor 11a. The diode 12a has its cathode connected to the anode of the thyristor 11a and its anode connected to the cathode of the thyristor 11a through the resistor 5a so as to have a polarity opposite to that of the thyristor 11a.

Meanwhile, the main current path of the GTO 1 is provided with a current detector 13 for detecting the value of the main current of the GTO 1. The output of this current detector 13 is applied to a control circuit 14. This control circuit 14 is a circuit which serves to selectively activate the sub snubber circuits 2a and 2b in accordance with the magnitude of the main current value of the GTO 1. The control circuit 14 includes a current setter 15a, a comparator 16a and an ignition pulse generator 17a which are provided for the sub snubber circuit 2a, as well as a current setter 15b a comparator 16b and an ignition pulse generator 17b which are provided for the sub snubber circuit 2b. One input of each of the comparator circuits 16a and 16b is supplied with the output of the current detector 13. The other inputs of the comparators 16a and 16b are respectively supplied with the outputs of the current setters 15a and 15b. The outputs of the comparators 16a and 16b are respectively applied to the ignition pulse generators 17a and 17b. The outputs of the ignition pulse generators 17a and 17b are respectively applied to the gate electrodes of the thyristor 11a of the sub snubber circuit 2a and the thyristor 11b of the sub snubber circuit 2b.

Next, the operation of the embodiment in FIG. 3 will be described. First, there will be explained the operation in a steady load mode in which the turnoff current of the GTO is comparatively low. In this case, the magnitude of the main current flowing through the GTO 1 is smaller than values set by the current setters 15a and 15b, so that signals of low level are delivered from the comparators 16a and 16b. Accordingly, no ignition pulse is generated from the ignition pulse generators 17a and 17b, and both the sub snubber circuits 2a and 2b are held inactive. In this case, accordingly, the device including the GTO is operated with only the main snubber circuit 2 which includes the capacitor 4 of comparatively small capacity, whereby the power loss of the snubber circuit is held at a minimum.

On the other hand, in a case where on account of a load fluctuation or the like, the turnoff current of the GTO 1 has exceeded the value set by the current setter 15a, the thyristor 11a corresponding thereto is ignited to activate the sub snubber circuit 2a. In this case, accordingly, the device including the GTO is operated with the main snubber circuit 2 and the sub snubber circuit 2a, and the capacity of the entire snubber capacitor can be increased to a value corresponding to the turnoff current.

Further, in a case where on account of an increased load, the turnoff current of the GTO 1 has exceeded the value set by the current setter 15b, also the thyristor 11b corresponding thereto is ignited. In this case, accordingly, the device including the GTO is operated with all of the main snubber circuit 2 and the sub snubber circuits 2a and 2b. Therefore, the capacity of the snubber capacitor can be increased further to cope with the increase of the turnoff current.

Figure 4:
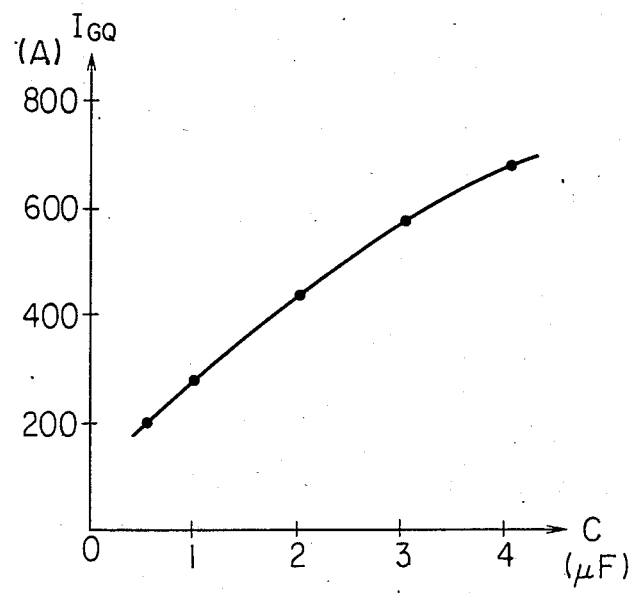
FIG. 4 is a graph showing an example of the relationship between the capacitance of a snubber capacitor and the magnitude of a gate turnoff current.

As described above, with the embodiment of FIG. 3, the necessary sub snubber circuits are activated depending upon the magnitude of the turnoff current of the GTO 1. Therefore, it is always possible to hold the capacity of the snubber capacitor at the optimum value and to hold the power loss of the snubber circuit at the minimum. FIG. 4 is a graph showing an example of the relationship between the capacitance C of the snubber capacitor and the current value $I_{GQ}$ which can be turned off under the gate control. On the basis of the relationship as shown in FIG. 4, the capacitances of the capacitors 4, 4a and 4b and the turnoff current values corresponding to the respective capacitor capacitances can be set to practical values.

The series circuit which consists of the diode 12a or 12b and the resistor 5a or 5b connected in parallel with the thyristor 11a or 11b can discharge the stored charges of the capacitor 4a or 4b therethrough within the turnon period of the GTO 1, so as to be ready for the next turnoff cycle.

Figure 5:
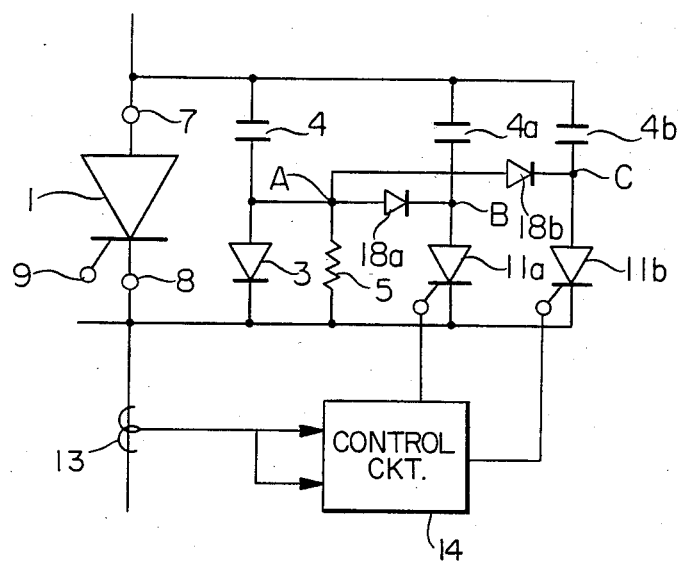
FIG. 5 is a partial circuit diagram showing another embodiment of this invention.

FIG. 5 is a circuit diagram showing another embodiment of this invention. This embodiment is an improvement on the portion of the discharge circuit of the embodiment shown in FIG. 3, and only the characterizing portion thereof is illustrated in FIG. 5. Referring to the figure, a diode 18a is connected across the node A of the diode 3 and the capacitor 4 and the node B of the thrystor 11a and the capacitor 4a. This diode 18a has its anode connected to the cathode of the thyristor 11a through the resistor 5 and its cathode connected to the anode of the thyristor 11a so as to have a polarity opposite to that of the thrystor 11a. In addition, a diode 18b is connected across the aforementioned node A and the node C of the thyristor 11b and the capacitor 4b. This diode 18b has its anode connected to the cathode of the thrystor 11b through the resistor 5 and its cathode connected to the cathode of the thyristor 11b so as to have a polarity opposite to that of the thyristor 11b.

According to the embodiment of FIG. 5 as stated above, charges stored in the capacitor 4a are discharged through the resistor 5 as well as the diode 18a, while charges stored in the capacitor 4b are discharged through the resistor 5 as well as the diode 18b. Thus, according to this embodiment of FIG. 5, the discharge resistor 5 of the main snubber circuit 2 can be used also as the discharge resistors of the sub snubber circuits 2a and 2b, and the circuit can be simplified.

Although the foregoing embodiments have been shown as being furnished with the two sub snubber circuits, it is obvious that more than two sub snubber circuits may well be disposed.

As the switching elements for use in the sub snubber circuits 2a and 2b, the thyristors 11a and 11b may well be replaced with transistors. In this case, turnon control signal generating circuits which generate the turnon control signals of the transistors for a fixed time interval in response to the outputs of the respective comparator circuits 16a and 16b may be disposed instead of the ingition pulse generators 17a and 17b.

As thus far described, according to this invention, a number of sub snubber circuits are selectively activated depending upon the magnitude of the turnoff current of a GTO. Therefore, the capacitance of the capacitor of a snubber circuit can be always held at an appropriate value, and the loss of the snubber circuit can be always minimized in conformity with the magnitude of the turnoff current, so that an efficient GTO device can be realized.

What is claimed is:

1. A semiconductor element having an anode, a cathode, and a control electrode which is controlled by signals applied to said control electrode, and a snubber circuit suppressing an abnormal rise in the anode-cathode voltage of said semiconductor element, said snubber circuit comprising:
   a main snubber circuit having a first series connected circuit comprising a first capacitor in series with a first diode connected between the anode and the cathode of said semiconductor element in the same polarity as that of said semiconductor element and a resistor connected in parallel with said first diode for discharging said capacitor;
   a sub snubber circuit having a second series circuit comprisng a second capacitor in series with a switching element and a second diode having an anode connected to a node between said first capacitor and said first diode of said first series connected circuit, and a cathode connected to a node between said second capacitor and said switching element of said second series connected circuit to discharge said second capacitor; and
   a control circuit which switching said switching element of said sub snubber circuit in accordance with the amount of main current flowing through said anode and said cathode of said semiconductor element.

2. A semiconductor element and a snubber circuit as defined in claim 1 wherein said semiconductor element is a gate turnoff thyristor, and said switching element of said sub snubber circuit is a thyristor which is connected in the same polarity as that of said gate turnoff thyristor.

3. A semiconductor element and a snubber circuit as defined in claim 1 wherein said semiconductor element is a gate turnoff thyristor, and said switching element is a thyristor which is connected in the same polarity as that of said gate turnoff thyristor.

4. A semiconductor element and a snubber circuit as defined in claim 1 including a plurality of sub snubber circuits, each having a series connected respective capacitor and respective switching element connected across said anode and said cathode of said semiconductor element, and wherein said semiconductor element is a gate turnoff thyristor and said switching element is a thyristor which is connected in the same polarity as that of said gate turnoff thyristor.

5. A semiconductor element and a snubber circuit as defined in claim 4 wherein said control circuit includes:
   a current detector which detects the amount of main current flowing through said gate turnoff thyristor, and for each sub snubber circuit:
      a respective comparator which compares an output of said current detector with a respective preset value and which detects that the amount of main current has exceeded a respective predetermined value, and
      a respective turnon signal generator which selectively turns on said respective switching element in response to an output of said respective comparator.

* * * * *